(12) United States Patent
Cheung

(10) Patent No.: US 9,627,406 B1
(45) Date of Patent: Apr. 18, 2017

(54) MEMORY CELL INCLUDING ELECTRET AND RANDOM ACCESS MEMORY THEREOF

(71) Applicant: NATIONAL INSTITUTE OF STANDARDS AND TECHNOLOGY, Gaithersburg, MD (US)

(72) Inventor: Kim P. Cheung, Rockville, MD (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 0 days.

(21) Appl. No.: 14/866,855

(22) Filed: Sep. 26, 2015

(51) Int. Cl.
*H01L 27/115* (2017.01)
*H01L 27/1159* (2017.01)
*H01L 27/11585* (2017.01)

(52) U.S. Cl.
CPC .... *H01L 27/1159* (2013.01); *H01L 27/11585* (2013.01)

(58) Field of Classification Search
CPC ......... H01L 27/11585; H01L 21/28291; H01L 27/11502; H01L 28/55; H01L 27/11507; G11C 11/22; G11C 11/16

USPC ......................................................... 257/295
See application file for complete search history.

(56) References Cited

U.S. PATENT DOCUMENTS

| 2006/0007722 | A1* | 1/2006 | Nordal | G11C 29/02 365/65 |
| 2007/0228432 | A1* | 10/2007 | Ishihara | G11C 11/22 257/295 |
| 2010/0243994 | A1* | 9/2010 | Yoon | H01L 21/28291 257/40 |

* cited by examiner

*Primary Examiner* — Walter H Swanson
(74) *Attorney, Agent, or Firm* — Toby D. Hain

(57) ABSTRACT

A memory cell includes: a polarizable member including an electret to store a plurality of bits; a thermal electrode to heat the polarizable member; and a program electrode opposing the thermal electrode to program the polarizable member in a bit comprising a polarized state or a non-polarized state, the polarizable member being interposed between the thermal electrode and the program electrode. A random access memory includes: a plurality of addressable memory cells, the memory cell including: a thermal electrode; a program electrode opposing the thermal electrode; a polarizable member interposed between the thermal electrode and the program electrode, the polarizable member including an electret to store a plurality of bits.

27 Claims, 14 Drawing Sheets

US 9,627,406 B1

MEMORY CELL INCLUDING ELECTRET AND RANDOM ACCESS MEMORY THEREOF

STATEMENT REGARDING FEDERALLY SPONSORED RESEARCH

This invention was made with United States government support from the National Institute of Standards and Technology. The government has certain rights in the invention.

BRIEF DESCRIPTION

Disclosed is a memory cell comprising: a polarizable member comprising an electret to store a plurality of bits; a thermal electrode to heat the polarizable member; and a program electrode opposing the thermal electrode to program the polarizable member in a bit comprising a polarized state or a non-polarized state, the polarizable member being interposed between the thermal electrode and the program electrode.

Further disclosed is a random access memory comprising: a plurality of addressable memory cells, the memory cell comprising: a thermal electrode; a program electrode opposing the thermal electrode; a polarizable member interposed between the thermal electrode and the program electrode, the polarizable member comprising an electret to store a plurality of bits.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a memory cell and a random access memory herein provide a non-volatile memory that includes an electret as a storage medium for a plurality of bits. To store a bit, the electret is subjected to heating in a presence of an electric field. Advantageously, the memory cell and random access memory achieve fast programming and long retention simultaneously with low energy consumption, high scalability, very high speed, and high reliability.

Figure 1:
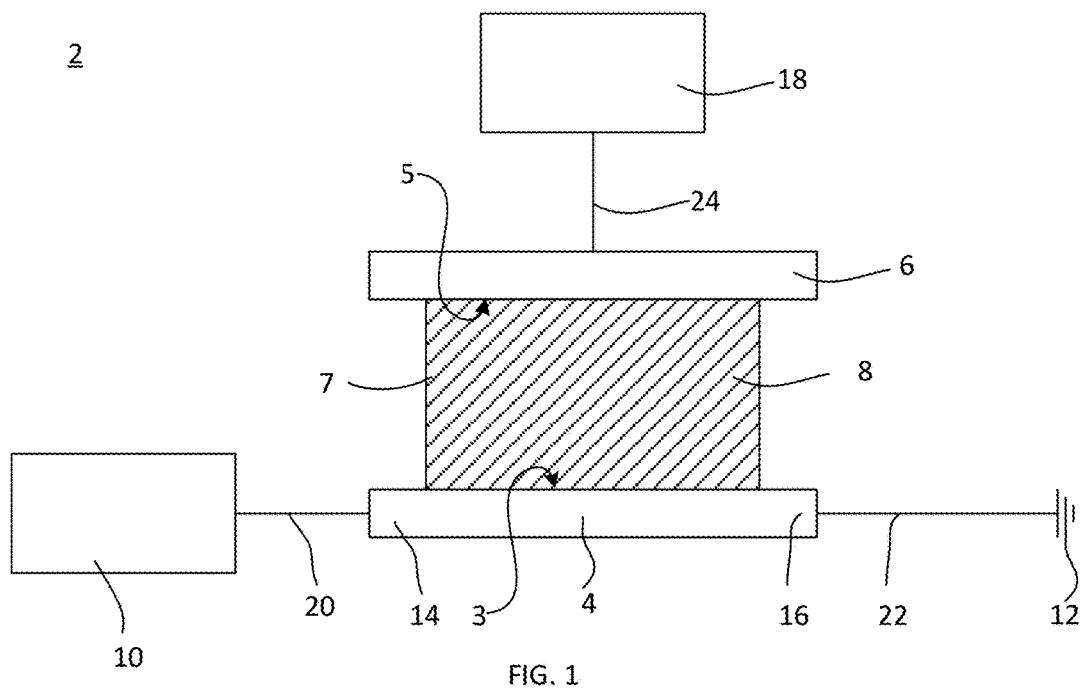
FIG. 1 shows a memory cell.

In an embodiment, as shown in FIG. 1, memory cell 2 includes polarizable member 7 that includes electret 8 to store a plurality of bits; thermal electrode 4 to heat polarizable member 7; and program electrode 6 opposing thermal electrode 4 and provided to program polarizable member 7 in a bit that includes a polarized state or a non-polarized state. Here, polarizable member 7 is interposed between thermal electrode 4 and program electrode 6, wherein first surface 3 of polarizable member 7 contacts thermal electrode 4, and second surface 5 of polarizable member 7 contacts program electrode 6. In some embodiments, thermal electrode 4 also includes first terminal 14 and second terminal 16, wherein first terminal 14 is configured to receive a heating current, and second terminal 16 is configured to communicate the heating current from thermal electrode 4 such that thermal electrode 4 is heated in response to the heating current present in thermal electrode 4.

In certain embodiments, memory cell 2 further includes first power source 10 in electrical communication with first terminal 14 to communicate the heating current to thermal electrode 14 via first wire 20. Program electrode 6 is configured to receive a program voltage, and memory cell 2 can include second power source 18 in electrical communication with program electrode 6 to provide the program voltage to program electrode 6 via third wire 24.

Figure 2:
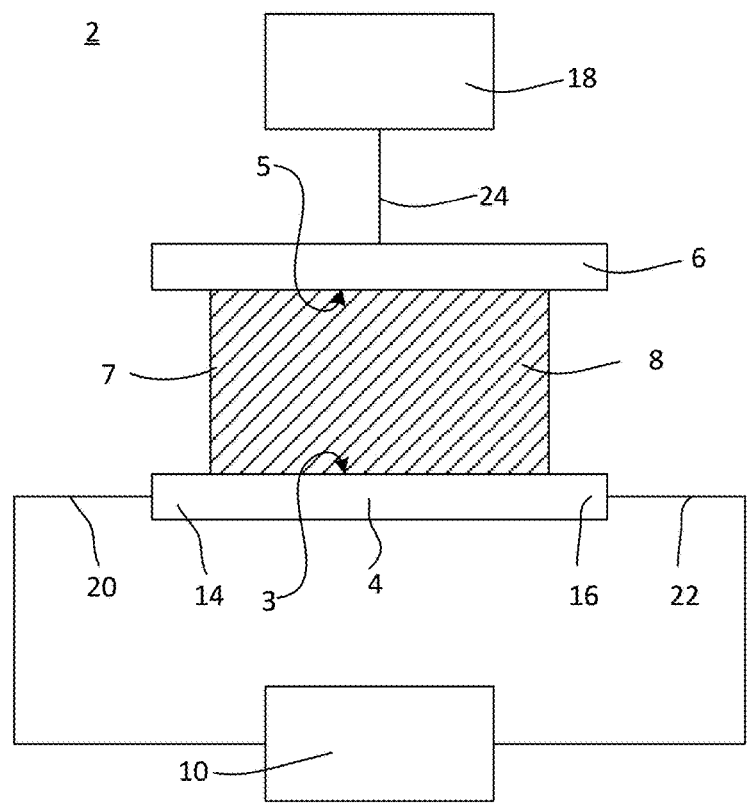
FIG. 2 shows a memory cell.

In an embodiment, as shown in FIG. 1, power sink 12 (e.g., an electrical ground, electrical reference, or the like) is in electrical communication with second electrode 16 of thermal electrode 4 to receive the heating current from thermal electrode 14 via second wire 22. In some embodiments, as shown in FIG. 2, first power source 10 is in electrical communication with first electrode 14 of thermal electrode 4 to communicate the heating current to thermal electrode 14 via first wire 20 and is in electrical communication with second electrode 16 of thermal electrode 4 to receive the heating current from thermal electrode 14 via second wire 22.

Figure 3:
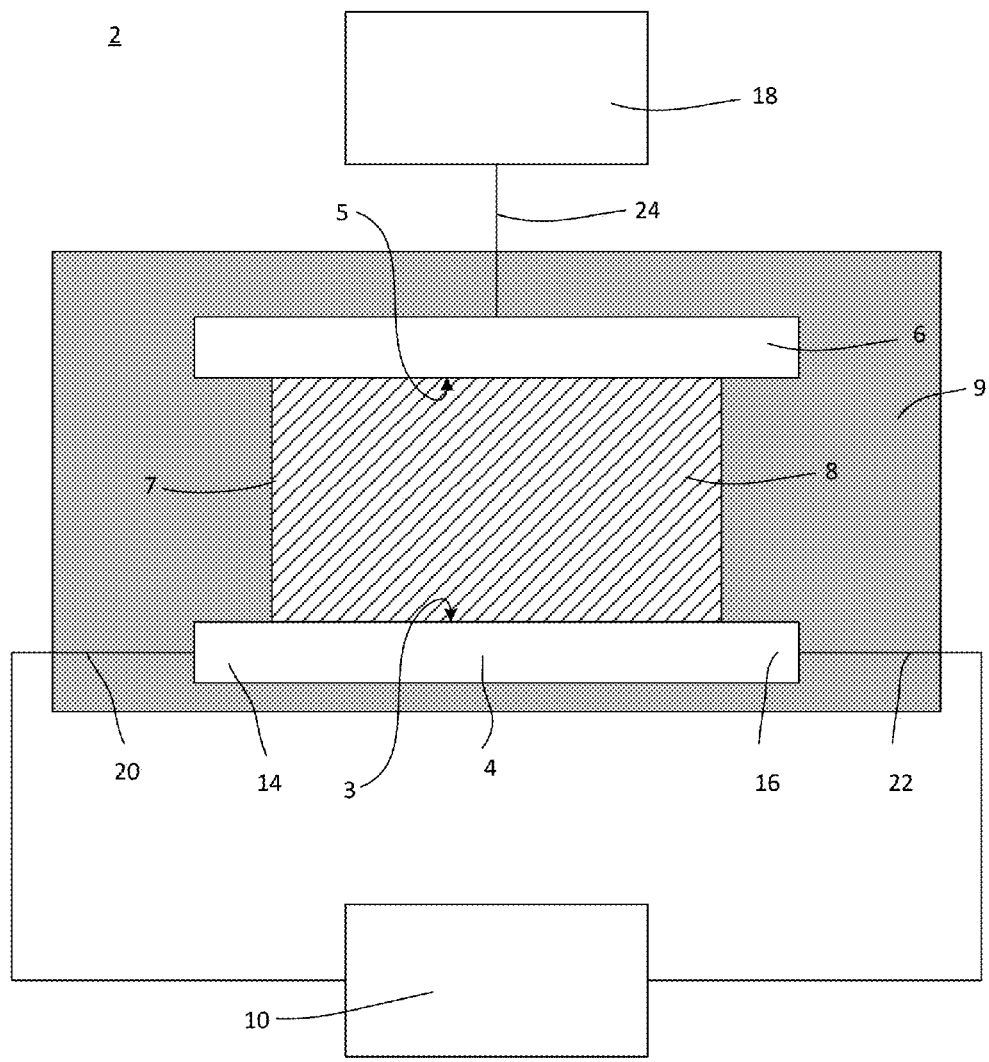
FIG. 3 shows a memory cell including a polarizable member disposed in an encapsulant.

According to an embodiment, as shown FIG. 3, in memory cell 2 further includes encapsulation member 9 to encapsulate polarizable member 7. Hence, electret 8 of polarizable member 7 is disposed in encapsulation member 9 such that electret 8 is not exposed to an external environment in which electret 8 could be subjected to decomposition by a component the external environment. It is contemplated that an operable lifetime of memory cell 2 is decades for electret 8 in a presence of encapsulation member 9.

Figure 4:
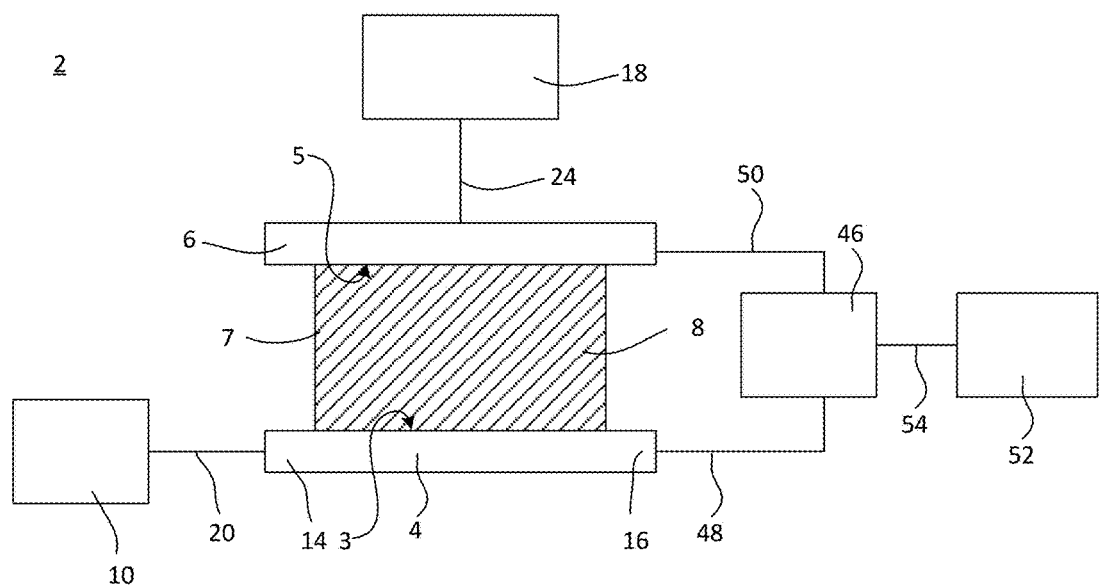
FIG. 4 shows a memory cell.
Figure 5:
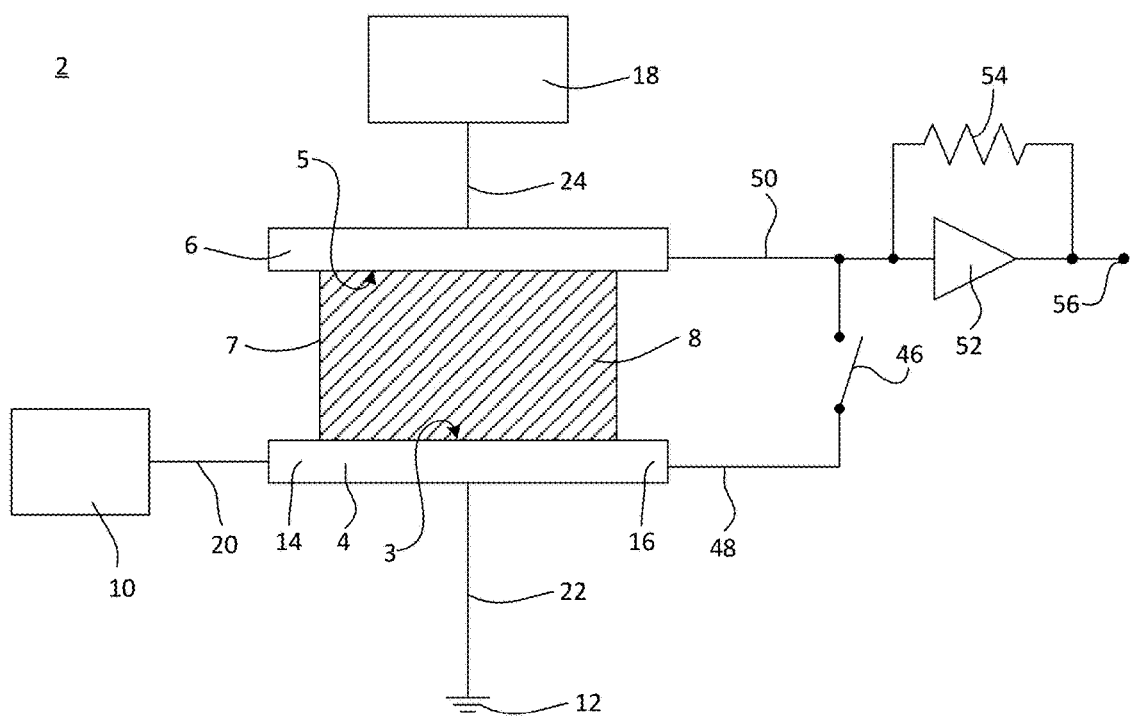
FIG. 5 shows a memory cell.

According to an embodiment, with reference to FIG. 4 and FIG. 5, memory cell 2 includes switch 46 in electrical communication with polarizable member 7. Switch 46 can include first switch terminal 48 in electrical communication with thermal electrode 4 and second switch terminal 50 in electrical communication with program electrode 6. Here, switch 46 is configured to electrically connect, in response to switch 46 being closed, thermal electrode 4 to program electrode 6 to depolarize first surface 3 and second surface 5 of electret 8, i.e., to electrically short first surface 3 to second surface 5. Additionally, switch 46 is configured to electrically disconnect, in response to switch 46 being open, thermal electrode 4 from program electrode 6 such that first surface 3 and second surface 5 of electret 8 are configured to be polarized.

In an embodiment, amplifier 52 is in electrical communication with switch 46 via wire 54 to detect a current or potential difference across polarizable member 7 at first surface 3 and second surface 5 via, e.g., program electrode 4 and second electrode 16 of thermal electrode 4. As shown in FIG. 5, resistor 54 can be connected across an amplifier 52, and output 56 is provided for detection of the current or voltage from memory cell 2 in response to actuation of switch 46.

According to an embodiment, memory cell 2 includes polarizable member 7 that is in the polarized state. In some embodiments, the polarized state includes a degree of polarization of electret 8 with respect to a direction perpendicular to second surface of 5 of program electrode 6 that is in contact with polarizable member 7. In an embodiment, polarizable member 7 is in the non-polarized state.

Figure 6:
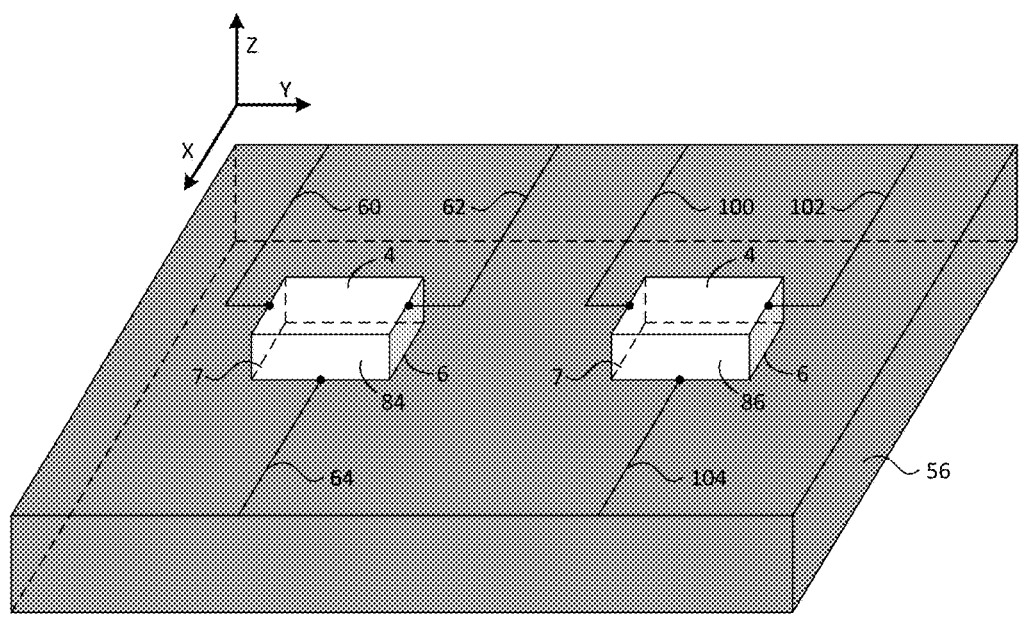
FIG. 6 shows a perspective view of a random access memory.
Figure 7:
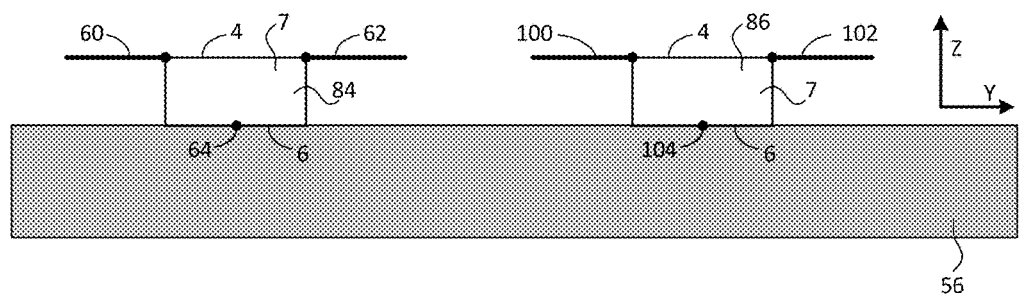
FIG. 7 shows a side view of a random access memory.

In an embodiment, with reference to FIG. 6 (perspective view with respect to x- y-, z-axis coordinate system) and FIG. 7 (side view from positive x-axis shown in FIG. 6), random access memory 200 includes a plurality of memory cells 2 (e.g., memory cell 84, memory cell 86, and the like) disposed on substrate 56. Memory cells 2 of the plurality of memory cells 2 are independently addressable or aggregately addressable, and each memory cell 2 includes thermal electrode 4, program electrode 6 opposing thermal electrode 4, and polarizable member 7 interposed between thermal electrode 4 and program electrode 6, wherein polarizable member 7 includes electret 8 to store a plurality of bits independently for each memory cell 2. Here, the plurality of independently addressable or aggregately addressable memory cells 2 includes memory cell 84 disposed on substrate 56 and memory cell 86 laterally disposed and proximate to memory cell 84 on substrate 56. Moreover, memory cell 84 includes: thermal electrode 4 that includes first terminal 14 (to receive heating current via wire 60) and second terminal 16 (to communicate heating current from thermal electrode 4 via wire 62), wherein thermal electrode 4 is heated in response to a presence of heating current in thermal electrode 4. Further, memory cell 84 includes program electrode 6 to receive program voltage via wire 64.

Memory cell 86 includes: thermal electrode 4 that includes first terminal 14 (to receive heating current via wire 100) and second terminal 16 (to communicate heating current from thermal electrode 4 via wire 102), wherein thermal electrode 4 is heated in response to a presence of heating current in thermal electrode 4. Further, memory cell 86 includes program electrode 6 to receive program voltage via wire 104.

Figure 8:
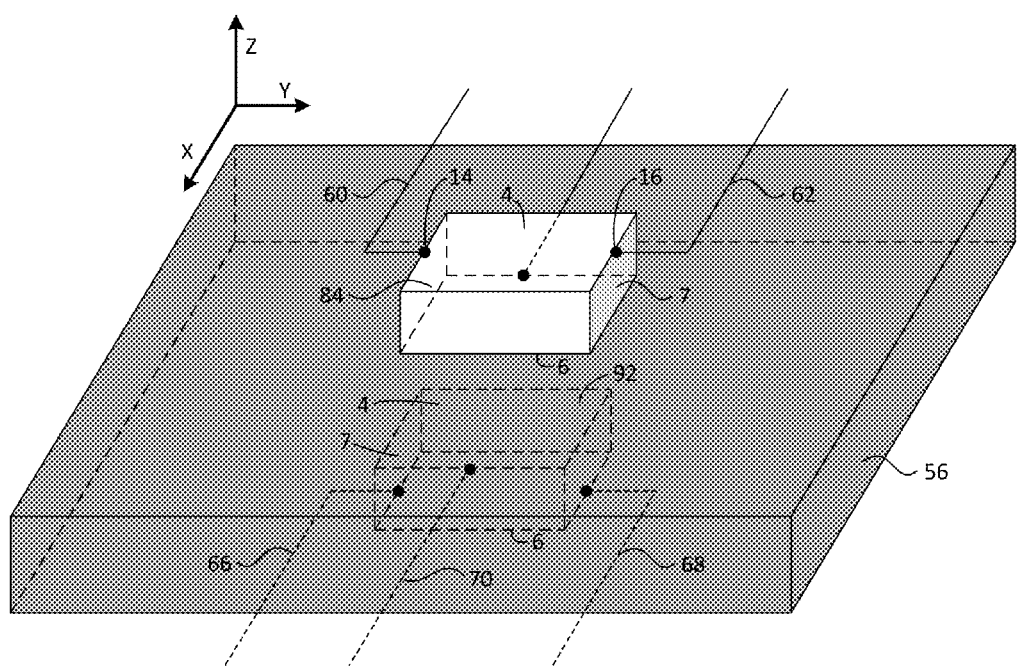
FIG. 8 shows a perspective view of a random access memory.
Figure 9:
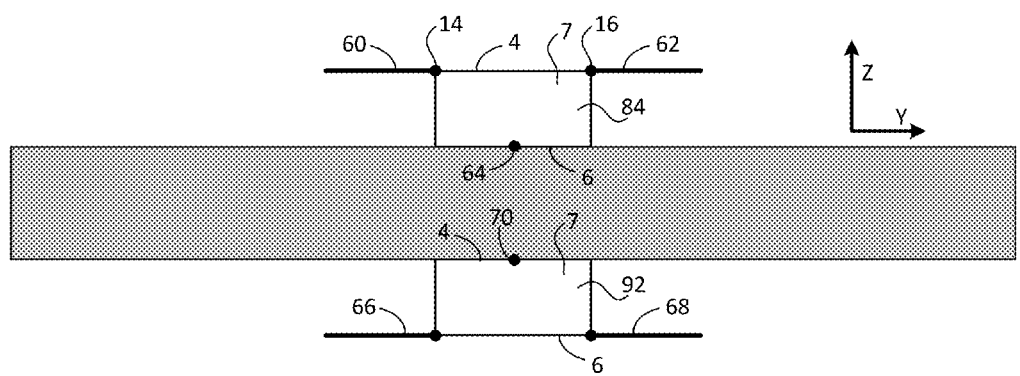
FIG. 9 shows a side view of a random access memory.

In an embodiment, with reference to FIG. 8 (perspective view with respect to x- y-, z-axis coordinate system) and FIG. 9 (side view from positive x-axis shown in FIG. 8), random access memory 200 includes a plurality of memory cells 2 (e.g., memory cell 84, memory cell 92, and the like) opposingly disposed on substrate 56. Memory cells 2 of the plurality of memory cells 2 are independently addressable or aggregately addressable, and each memory cell 2 includes thermal electrode 4, program electrode 6 opposing thermal electrode 4, and polarizable member 7 interposed between thermal electrode 4 and program electrode 6, wherein polarizable member 7 includes electret 8 to store a plurality of bits independently for each memory cell 2. Here, the plurality of independently addressable or aggregately addressable memory cells 2 includes memory cell 84 disposed on substrate 56 and memory cell 92 stackedly disposed on memory cell 84 on an opposing surface of substrate 56. That is, memory cell 84 and memory cell 92 are stacked relative to one another and disposed on opposing surfaces of substrate 56.

Moreover, memory cell 84 includes: thermal electrode 4 that includes first terminal 14 (to receive heating current via wire 60) and second terminal 16 (to communicate heating current from thermal electrode 4 via wire 62), wherein thermal electrode 4 is heated in response to a presence of heating current in thermal electrode 4. Further, memory cell 84 includes program electrode 6 to receive program voltage via wire 64.

Memory cell 92 includes: thermal electrode 4 that includes first terminal 14 (to receive heating current via wire 66) and second terminal 16 (to communicate heating current from thermal electrode 4 via wire 68), wherein thermal electrode 4 is heated in response to a presence of heating current in thermal electrode 4. Further, memory cell 92 includes program electrode 6 to receive program voltage via wire 70.

Figure 10A:
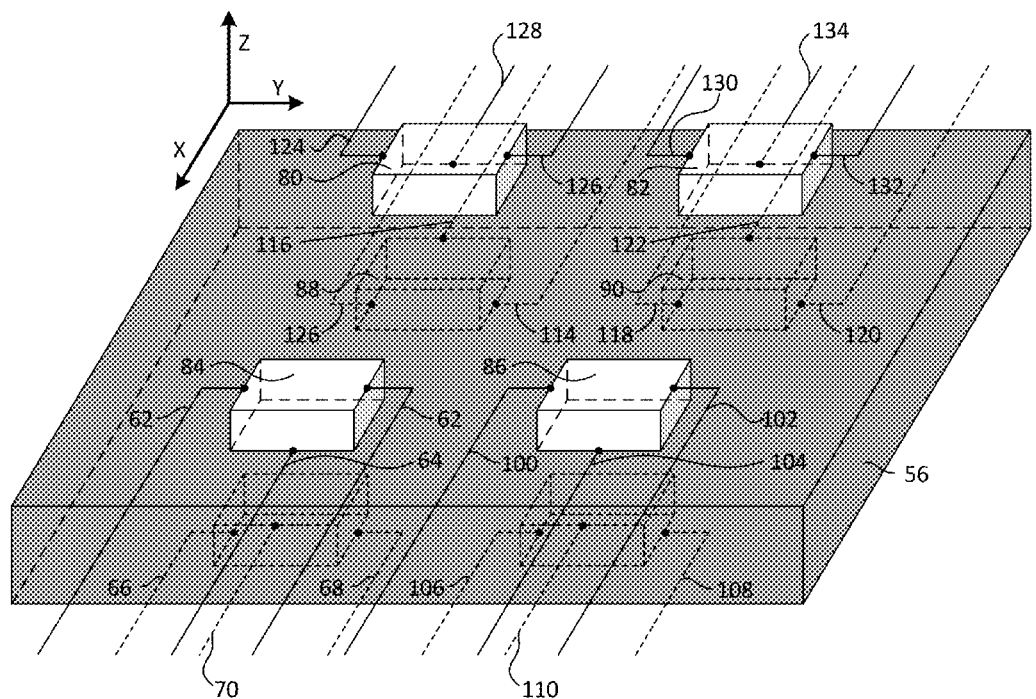
FIG. 10A shows a perspective view of a random access memory.
Figure 10B:
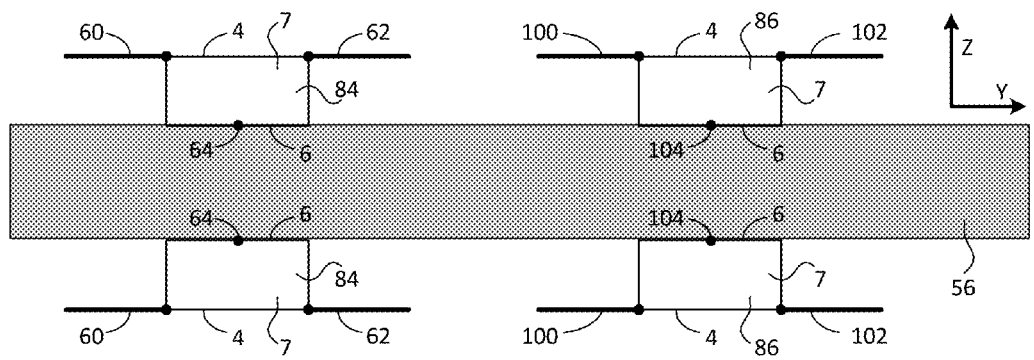
FIG. 10B shows a side view of a random access memory.
Figure 11A:
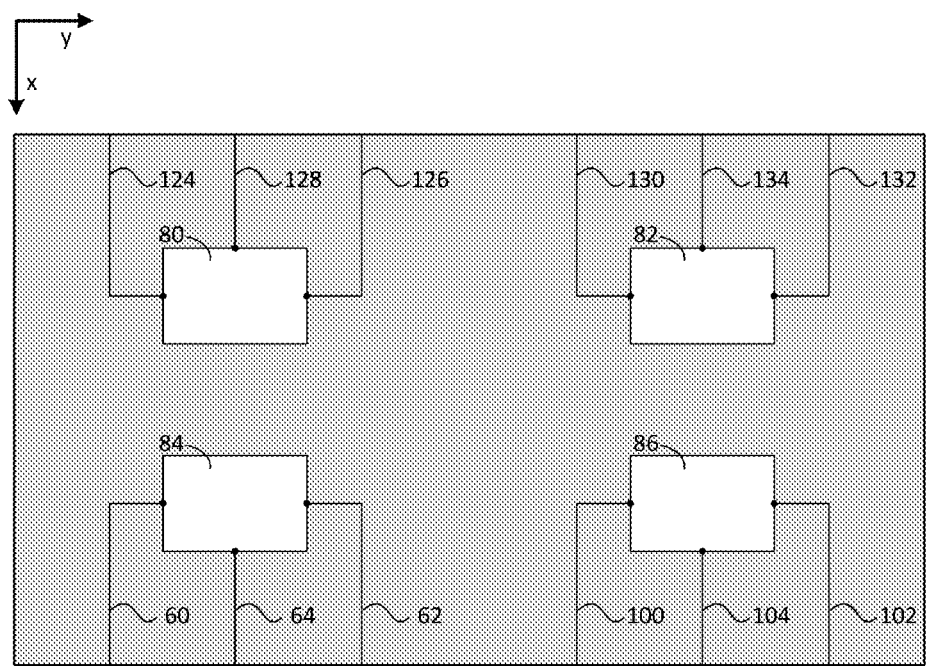
FIG. 11A shows a top view of a random access memory.
Figure 11B:
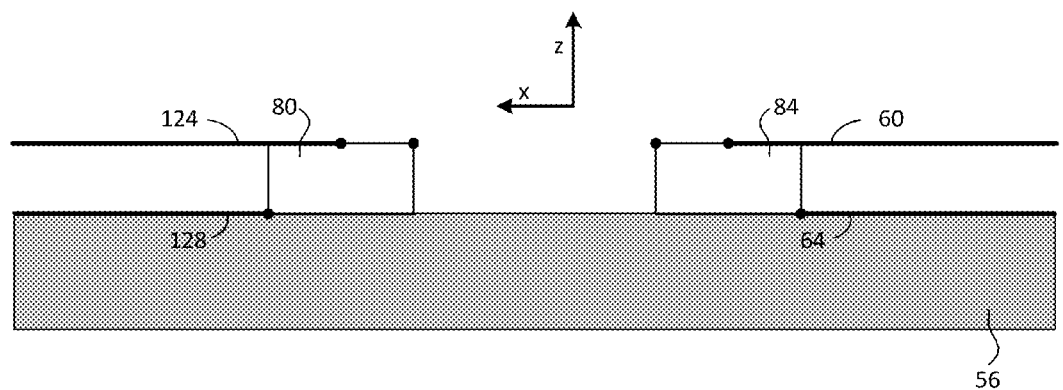
FIG. 11B shows a perspective view of a random access memory.

In an embodiment, with reference to FIG. 10A (perspective view with respect to x- y-, z-axis coordinate system) FIG. 10B (side view from positive x-axis shown in FIG. 10A), FIG. 11A (top view from positive y-axis shown in FIG. 10A), and FIG. 11B (side view from positive y-axis shown in FIG. 10A), random access memory 200 includes a plurality of memory cells 2 (e.g., memory cell 80, 82, 84, 86, 88, 19, 92, 94) such that some memory cells 2 (e.g., memory cell 80, 82, 84, and 86; memory cell 88, 90, 92, and 94) are laterally disposed on substrate 56, and some memory cells 2 (e.g., memory cells 80 and 88; memory cells 82 and 90; memory cells 84 and 92; memory cells 86 and 94) are opposingly disposed on substrate 56. In this configuration, memory cells 2 are arranged in a three-dimensional array having a size n×m×p, wherein n is an integer number of memory cells 2 present in an x-direction; m is an integer number of memory cells present in a y-direction; and p is an integer number of memory cells present in a z-direction. Here, memory cells 2 of the plurality of memory cells 2 are independently addressable or aggregately addressable, and each memory cell 2 includes thermal electrode 4, program electrode 6 opposing thermal electrode 4, and polarizable member 7 interposed between thermal electrode 4 and program electrode 6, wherein polarizable member 7 includes electret 8 to store a plurality of bits independently for each memory cell 2.

The plurality of independently addressable or aggregately addressable memory cells 2 includes memory cell 80 disposed on substrate 56, memory cell 82 laterally disposed to memory cell 80, memory cell 84 laterally disposed to memory cells (80, 82), memory cell 86 laterally disposed to memory cells (80, 82, 84), memory cell 88 stackedly disposed to memory cell 80, memory cell 90 stackedly disposed to memory cell 82, memory cell 92 stackedly disposed to memory cell 84, and memory cell 94 stackedly disposed to memory cell 86 such that substrate 56 separates memory cells (80, 82, 84, 86) from memory cells (88, 90, 92, 94). It is contemplated that encapsulation 9 can be disposed on memory cells (80, 82, 84, 86, 88, 90, 92, 94) in some embodiments. According to an embodiment, encapsulation 9 and substrate 56 include substantially similar or same material. In a particular embodiment, encapsulation 9 and substrate 56 include different materials.

Moreover, memory cells (80, 82, 84, 86, 88, 90, 92, 94) independently receive heating current respectively via wire (124, 130, 60, 100, 112, 118, 66, 106), independently communicate heating current from thermal electrodes 4 respectively via wire (126, 132, 62, 102 114, 120, 68, 108), or independently receive program voltage respectively via wire (128, 134, 64, 104, 116, 122, 70, 110), wherein thermal electrodes 4 independently are heated in response to a presence of heating current in thermal electrodes 4.

Heating current in program voltage independently can be provided via a power source. Exemplary power sources include those that provide a current pulse, voltage pulse, direct current voltage, alternating current voltage, and the like.

In an embodiment, polarizable member 7 includes electret 8. Polarizable member 7 can be an ultra thin film disposed between and separating thermal electrode 4 and program electrode 6. Electret includes a glassy polymer that has a net electric dipole moment that is not zero and a glass transition temperature (Tg) that is greater than an operation temperature of memory cell 2. Without wishing to be bound by theory, it is believed that electret 8 is a material (such as glassy polymer) that retains a static charge in response to: subjecting electret 8 to an electric field at a first temperature greater than a glass transition temperature (Tg) of electret 8 to provide electret 8 with a polarization state; and subsequently cooling electret 8 from the first temperature to a second temperature that is less than the Tg while maintaining electret 8 in a presence of the electric field, wherein electret 8 maintains the polarization state at the second temperature in an absence of the electric field. As used herein, "remnant polarization" refers to the polarization state present in electret 8 at a temperature less than the Tg. Accordingly, with respect to the conditions in this paragraph, in absence of the electric field at the second temperature, electret 8 has the polarization state and exhibits remnant polarization.

According to an embodiment, the glassy polymer includes a polar organic polymer. Exemplary polar organic polymers include a polyimide, polysulfone, polyether, polyacetal, polyacetaldehyde, polyacrylamide, poly(acrylic acid), polyacrylonitrile, polyamide, polyamide imide, polyaniline, polybenzimidazole, polybenzobisoxazole, polybenzobisthiazole, polybutylene terephthalate, polycarbonate, 1,4-polychloroprene, polychlorotrifluoroethylene, poly(diethylsiloxane), poly(dimethylsiloxane), poly(diphenylsiloxane), polyester, polyether ketone, polyether etherketone, polyethersulfone, poly(ethylene imine), poly(ethylene oxide), poly(ethyleneterephthalate), poly(hexamethylene adipamide), poly(hexamethylene sebacamide), polyhydroxybutyrate, polyisocyanate, polyisocyanide, 1,4-polyisoprene, polylactam, polylactone, poly(methacrylic acid), poly(methyl acrylate), poly(methyl methacrylate), poly(4-methyl pentene), poly(methyl styrene), poly(methylene oxide), poly(methyl phenyl siloxane), poly(phenylene terephthalamide), polynitrile, poly(methyl styrene), poly(3-propionate), polypyrazole, poly(pyromellitimide-1,4-diphenyl ether), polypyrrole, polyquinoxaline, polystyrene, polysulfide, polytetrafluoroethylene, polythienyl vinylene, polythiopene, poly(trimethylene ethylene urethane), polyurea, polyurethane, poly(vinyl acetate), poly(vinyl carbazole), poly(vinyl chloride), poly(vinyl fluoride), poly(vinyl formal), poly(2-vinyl pyridine), poly(n-vinyl pyrrolidone), poly(vinylidene chloride), poly(vinylidene fluoride), poly(p-xylylene), vinyl polymer, polyarylate, polyphenylene sulfide, polyetherimide, polyphenylsulfone, or a combination comprising at least one of the foregoing.

In an embodiment, electret 8 includes a polyfluorinated polymer (e.g., polytriflouroethylene, Tg=280° C.), a polyimide (e.g., (2,6-bis(3-aminophenoxy)benzonitrile)-4,4'oxdiphalic anhydride ((beta-CN)-APB/ODPA) polyimide), Tg=220° C., remnant polarization Pr=20 mC/m$^2$), a polyvinylacetate (e.g., poly(vinylidene cyanide-vinylacetate) (P(VDCN-Vac), Tg=170° C., Pr=50 mC/m$^2$), a polynitrile (e.g., polyphenylethernitrile (PPEN), Tg=145°, Pr=12 mC/m$^2$), or a combination thereof.

It is contemplated that the glassy polymer has an amorphous structure at a temperature less than the glass transition temperature of the glassy polymer.

In an embodiment, polarizable member includes an additive in addition to electret 8. The additive can be a material that is thermally conductive to rapidly distribute the heat provided by thermal electrode 4 through electret 8 and polarizable member 7 in a rapid response to heating of thermal electrode 4 due to presence of the heating current in thermal electrode 4. In some embodiments, the additive can be a material that has an electrical resistance or dielectric strength to provide polarizable member 7 with a selected electrical resistance in view of a thickness of polarizable member 7 with respect to polarizable member 7 being interposed between thermal electrode 4 and program electrode 6, which at a selected time respectively can be subjected to the heating current and program voltage. Accordingly, the additive can provide resistance to electrical breakdown through polarizable member 7 and electrical shorting of thermal electrode 4 to program electrode 6.

Exemplary additives include diamond (e.g., nanodiamonds), boron nitride, alumina, and the like, or a combination thereof having a particle size selected to be thermally conductive.

In an embodiment, thermal electrode 4 includes first terminal 14 to receive the heating current and second terminal 16 to communicate the heating current from thermal electrode 4. First terminal 14 and second terminal 16 independently can be a monolithic component of thermal electrode 4 or a separate component disposed on thermal electrode 4 to be in electrical communication with thermal electrode 14. Thermal electrode 4 can include a thermally conductive material that is heated in response to presence of heating current in thermal electrode 14 and communicates the heat to polarizable member 7. Exemplary materials for thermal electrode 4 include titanium nitride, titanium tungsten, nickel silicide, titanium silicide, cobal silicide, tungsten silicide, tantalum nitride], or a combination thereof. According to an embodiment, thermal electrode 4 is titanium nitride. First terminal 14 and second terminal 16 independently can be a same or different material as thermal electrode 14 and includes a material recited for thermal electrode 14.

Program electrode 6 is configured to receive the program voltage Program electrode 6 can include an electrically conductive material that communicates the program voltage to polarizable member 7. Exemplary materials for program electrode 6 include copper, aluminum, tungsten, titanium nitride, tantalum nitride, titanium silicide, nickel silicide, tungsten silicide, or a combination thereof. According to an embodiment, program electrode 6 is copper.

In an embodiment, encapsulation member 9 includes the encapsulant in which polarizable member 7 is disposed. The encapsulant protects electret 8 from contamination or deterioration that could occur if electret 8 was exposed to an environmental element such as air that could oxidize electret 8 when heated. Exemplary materials for the encapsulant include an oxide, a nitride, a silicide, copper, aluminum, tungsten, or a combination thereof. Exemplary oxides include silicon dioxide, or a combination thereof. Exemplary nitrides include silicon nitride, or a combination thereof. Exemplary silicides include nickel silicide, titanium silicide, tungsten silicide, or a combination thereof exemplary copper, silicon dioxide, silicon nitride include copper/titanium, copper/titanium nitride, aluminium/titanium nitride, or a combination thereof.

According to an embodiment, memory cell 2 is disposed on substrate 56. Substrate 56 can be a same or different material than materials recited for the encapsulant. Substrate 6 can provide electrical insulation or thermal insulation among thermal electrodes 4, program electrodes 4, polarizable members 7, and the like. Exemplary materials for substrate 56 include silicon, silicon dioxide, silicon nitride, or a combination thereof.

In an embodiment, a process for making memory cell 2 includes disposing thermal electrode 4 on substrate 56; disposing polarizable member 7 including electret 8 on thermal electrode 4; and disposing program electrode 6 on polarizable member 7 and opposing thermal electrode 4 to form memory cell 2. The process for making memory cell 2 further can include encapsulating polarizable member 7 by disposing encapsulating member including the encapsulant on memory cell 2.

According to an embodiment, the process includes disposing an oxide on substrate 56 by chemical vapor deposition (CVD), disposing material for thermal electrode 4 by physical vapor deposition (PVD), spin coating a photoresist thereon, performing lithography to print thermal electrode 4, etching to form thermal electrode 4, disposing encapsulation member 9 by CVD, planarizing the top surface by chemical-mechanical polishing (CMP), spin coating a photoresist on top, printing by lithography a via hole in the encapsulation material 9, filling the via hole by spin coating the electret 8 material on top, cure the electret 8 material using heat or light, re-exposing the encapsulation material 9 surface by etching back to remove the electret 8 material on top of the encapsulation material 9, disposing program electrode 6 material by PVD, spin coating a photo resist on top of everything, print program electrode 6 by photolithography, etching program electrode 6 material to form the electrode 6, disposing encapsulation material 9 on opt of everything by CVD, planarizing the surface by CMP, disposing a photoresist on top by spin coating, printing contact holes by lithography, opening the contact holes by etching to provide communication between external electric connections and thermal electrode 4 as well as program electrode 6.

The process also can include connecting first power source 10 to thermal electrode 4 and connecting second power source 18 to program electrode 6.

In an embodiment, a process for making random access memory 200 includes disposing thermal electrode 4 on substrate 56; disposing polarizable member 7 including electret 8 on thermal electrode 4; and disposing program electrode 6 on polarizable member 7 and opposing thermal electrode 4 to form a plurality of memory cell 2 disposed on substrate 56. The process for making memory cell 2 further can include encapsulating polarizable member 7 by disposing encapsulating member including the encapsulant on memory cells 2.

According to an embodiment, with reference to FIG. 7 and FIG. 13, two identical memory cells 84 and 86, each has three terminals 60, 62, 64, and 100, 102, 104, can be independently accessed as follows: Starts with all terminals grounded E1 and both cells are non-polarized P1 and at temperature T2. To program only cell 84, terminal 62 is pull up at t2 in voltage and a current will flow between terminals 62 and 60. Cell 84 temperature quickly changes from T2 to T1. At t3, terminal 64 is changed from S1 to S2 and polarization of cell 84 changes from P1 to P2. At t4, the voltage at terminal 62 is returned to ground and temperature in cell 84 also changes from T1 back to T2. At t5 terminal 64 is changed from S2 back to S1 and programming of cell 84 is complete. To program only cell 86, the above description can be repeated with terminals substituted by the corresponding ones, such that 100 replace 60, 102 replace 62 and 104 replace 64. To read cell 84 only, terminal 64 is abruptly disconnected from ground. The transient current flowing into or out of terminal 64 is measured. This current is proportional to the polarization state of cell 84. Similarly, to read cell 86, transient current in terminal 104 is measured after it is abruptly disconnected from ground.

Random access memory 200 can be used as high-speed cache memory directly integrated on top of the microprocessor circuit within an integrated circuit chip. It can also be used as off chip high-density main memory within a computer. It can also be used as low cost, high density mass storage memory in the computer as well as off the computer.

Figure 12:
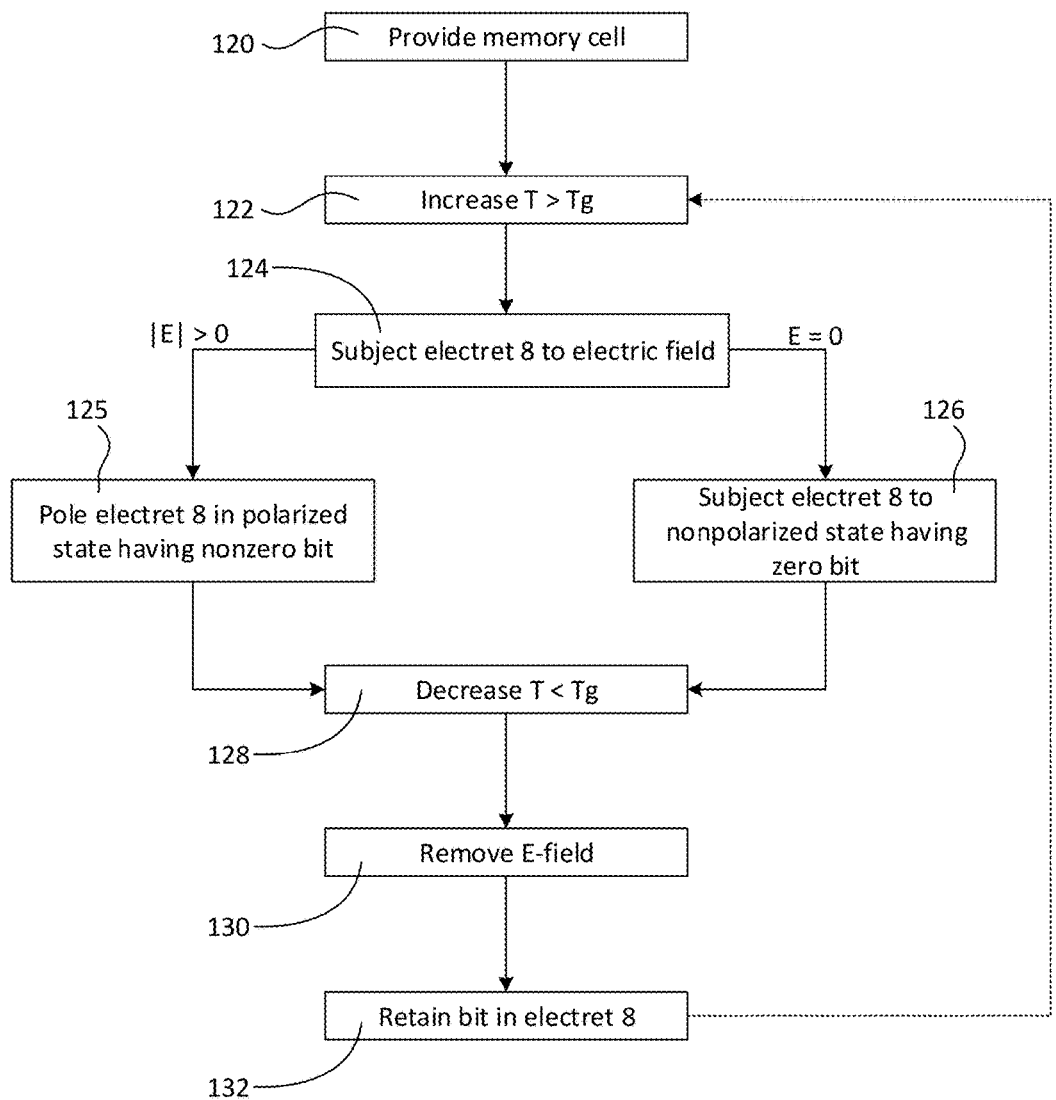
FIG. 12 shows a flow chart of a process for storing a bit in a memory cell.

In an embodiment, with reference to FIG. 12, a process for storing data in memory cell 2 includes providing memory cell 2 (step 120); electrically connecting thermal electrode 4 to first power source 10; electrically connecting program electrode 6 to second power source 18; communicating the heating current from first power source 10 to thermal electrode 4; increasing a temperature of polarizable member 7 and electret 8 to a first temperature that is greater than the Tg of electret 8 (step 122); communicating the program voltage from second power source 18 to program electrode; subjecting electret 8 to an electric field (step 124) having a magnitude (i.e., electric field strength, |E|) that is zero (|E|=0) when a voltage difference (ΔV) between thermal electrode 4 and program electrode 6 is zero (ΔV=0) or non-zero (|E|>0) when a voltage difference between thermal electrode 4 and program electrode 6 is not zero (ΔV≠0); placing electret 8 in a state of polarization (either the polarized state or non-polarized state) by: poling electret 8 in the polarized state having a nonzero bit when the magnitude is greater than zero (step 125), or subjecting electret 8 to the non-polarized state having a zero bit when the magnitude is zero (step 126); decreasing the temperature of electret 8 to a second temperature that is less than Tg in response to an absence of the heating current in thermal electrode 4 (step 128) while maintaining the magnitude of the electric field; removing the electric field (step 130); and retaining the polarization state having the bit in electret 8 after removing the electric field at the second temperature (step 132) to store data in memory cell 2.

Here, polarizable member 7 and electret 8 are heated above Tg in presence of the heating current at thermal electrode 4, wherein the heating current includes a first pulse width and first voltage. Program electrode 4 receives the program voltage that includes a second pulse width and a second voltage. Accordingly, polarizable member 7 receives the first voltage at thermal electrode 4 and the second voltage at program electrode 6. In response, electret 8 is programmed: in the polarized state with the nonzero bit in response to receipt of the first voltage and the second voltage when the first temperature is greater than Tg and the first voltage is different than the second voltage; or in the non-polarized state with the zero bit in response to receipt of the first voltage and the second voltage when the first temperature is greater than Tg and the first voltage is the same as the second voltage. Further, electret 8 maintains the state of polarization with the bit after the electric field is removed at the second temperature. Here, the value of the bit is proportional to a degree of polarization of electret 8 with respect to a direction perpendicular to second surface 5 of program electrode 6 that is in contact with polarizable member 7.

Figure 13:
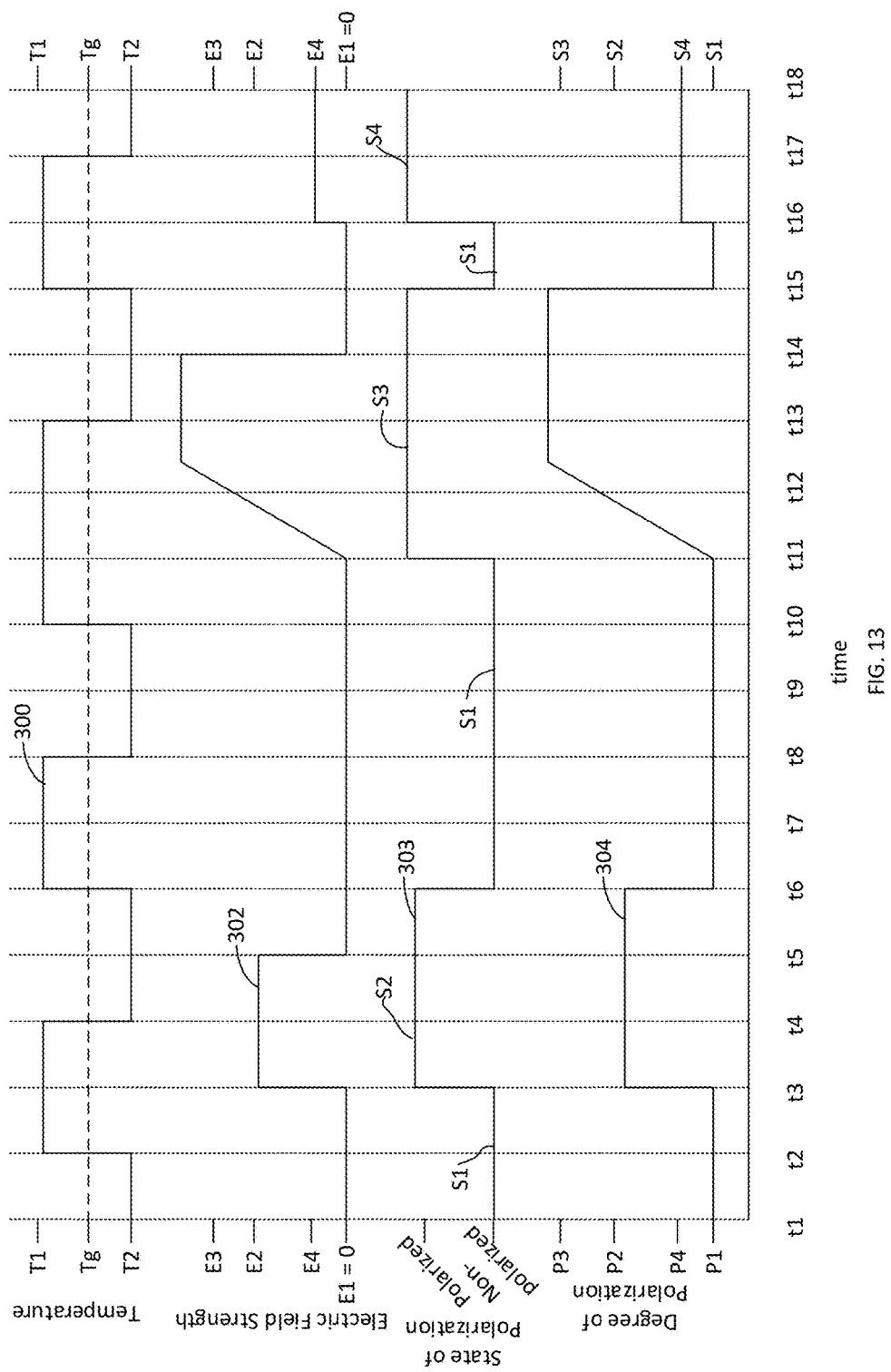
FIG. 13 shows a graph of potential difference versus time.

An illustration of repeatedly storing data in memory cell 2 is shown in FIG. 13, wherein temperature profile 300 of electret 8 is shown as a graph of temperature versus time; electric field profile 302 of electret 8 is shown as a graph of electric field strength versus time; state profile 303 of electret 8 is shown as a graph of state of polarization versus time; and polarization profile 304 of electret 8 is shown as a graph of degree of polarization versus time. Here, at time t1, a temperature of electret 8 is second temperature t2 that is less than Tg; electric field strength applied across electret 8 is first electric field strength E1 that has a value of zero (i.e., E1=0) because the first voltage at thermal electrode 4 and the second voltage at program electrode 6 are the same (i.e., $\Delta V=0$); and a state to polarization of electric 8 is non-polarized state S1 state due to E1=0. Thereafter, at time t2, the temperature of electret 8 increases from second temperature T2 to first temperature T1 that is greater than Tg due in response to presence of the heating current at thermal electrode 4, and the state of polarization of electret 8 is non-polarized state S1 because E1=0 due to adjustment of a relative value of the first voltage and the second voltage such that $\Delta V=0$. At time t3, electret 8 is subjected to first temperature T1 and second electric field strength E2 that is greater than zero such that the state of polarization of electret 8 is second polarized state S2, i.e., electret 8 is in the polarized state at time t3. At time t4, the temperature of electric 8 decreases from first temperature T1 to second temperature T2 due to absence of heating current at thermal electrode 4, and second electric field strength E2 is maintained such that the state of polarization of electret 8 maintains second polarized state S2, i.e., electret 8 maintains the polarized state at time t4 even though the temperature of electret 8 is second temperature T2 that is less than Tg. At time t5, electric field strength applied to electret to relate transitions from second electric field strength E2 to first electric field strength E1, and state of polarization of electret 8 is maintained at second polarized state S2 even in an absence of an electric field such that electret 8 in a second polarized state S2 includes a stored bit that is nonzero.

At time t6, the temperature of electret 8 increases from second temperature T2 to first temperature T1 that is greater than Tg while first electric field strength E1 is maintained such that the state a polarization of electret 8 transitions from second polarized state S2 to first non-polarized state S1, wherein electret 8 obtains a zero bit. At time t7, the temperature of electret 8 maintains first temperature T1, and electret 8 is subjected to first electric field strength E1 so that electret 8 maintains first non-polarized state S1 and the zero bit. At time t8, the temperature of electret 8 decreases from first temperature T1 to second temperature T2, and electret 8 is subjected to first electric field strength E1 so that electret 8 maintains first non-polarized state S1 and the zero bit. At time t9, the temperature of electret 8 maintains second temperature T2, and electret 8 is subjected to first electric field strength E1 so that electret 8 maintains first non-polarized state S1 and the zero bit. At time t10, the temperature of electret 8 increases from second temperature T2 to first temperature T1, and electret 8 is subjected to first electric field strength E1 so that electret 8 maintains first non-polarized state S1 and the zero bit. From time t11, through time t12, and between times t12 and t13, first temperature T1 is maintained while the electric field strength variably increases from first electric field strength (E1=0) to third electric field strength (E3>E2>E1=0), and the state of polarization of electret 8 varies proportionately with electric field strength from first non-polarized state S1 to third polarized state S3 (having a third nonzero bit) that has degree of polarization P3 that is greater than degree of polarization P2 for second polarized state S2 (having a second nonzero bit), wherein a value of the third nonzero bit is greater than a value of the second nonzero bit.

At time t13, the temperature of electret 8 decreases from first temperature T1 to second temperature T2, and electret 8 is subjected to third electric field strength E2 so that electret 8 maintains third polarized state S3 with degree of polarization P3 and third nonzero bit. At time t14, the temperature of electret 8 is maintained at second temperature T2, and electret 8 is subjected to a change from third electric field strength E3 to first electric field strength E1 so that electret 8 maintains third polarized state S3 with degree of polarization P3 and third nonzero bit. At time t15, the temperature of electret 8 increases from second temperature T2 to first temperature T1, and electret 8 is subjected to first electric field strength E1 so that electret 8 transitions from third polarization state S3 (with degree of polarization P3 and third nonzero bit) to first polarized state S1 (with degree of polarization P1 and the zero bit). At time t16, the temperature of electret 8 is maintained at second temperature T2, and electret 8 is subjected to a change from first electric field strength E1 to fourth electric field strength E4 so that electret 8 transitions from first polarized state S1 (with degree of polarization P1 and the zero bit) to fourth polarized state S4 (with degree of polarization P4 and fourth nonzero bit, wherein degree of polarization P4<P2<P3, a value of fourth nonzero bit is less than that of second nonzero bit, which is less than that of third nonzero that).

At time t17, the temperature of electret 8 decreases from first temperature T1 to second temperature T2, and electret 8 is subjected to fourth electric field strength E4 so that electret 8 maintains fourth polarized state S4 (with degree of polarization P4 and fourth nonzero bit). At time t18, the temperature of electret 8 is maintained at second temperature T2, and electret 8 is subjected to fourth electric field strength E4 so that electret 8 maintains fourth polarized state S4 (with degree of polarization P4 and fourth nonzero bit). At a time subsequent to t18 and at second temperature T2, electret 8 can be subjected to first electric field strength E1, and electret 8 will maintain fourth polarized state S4 (with degree of polarization P4 and fourth nonzero bit) in absence of an electric field.

Figure 14:
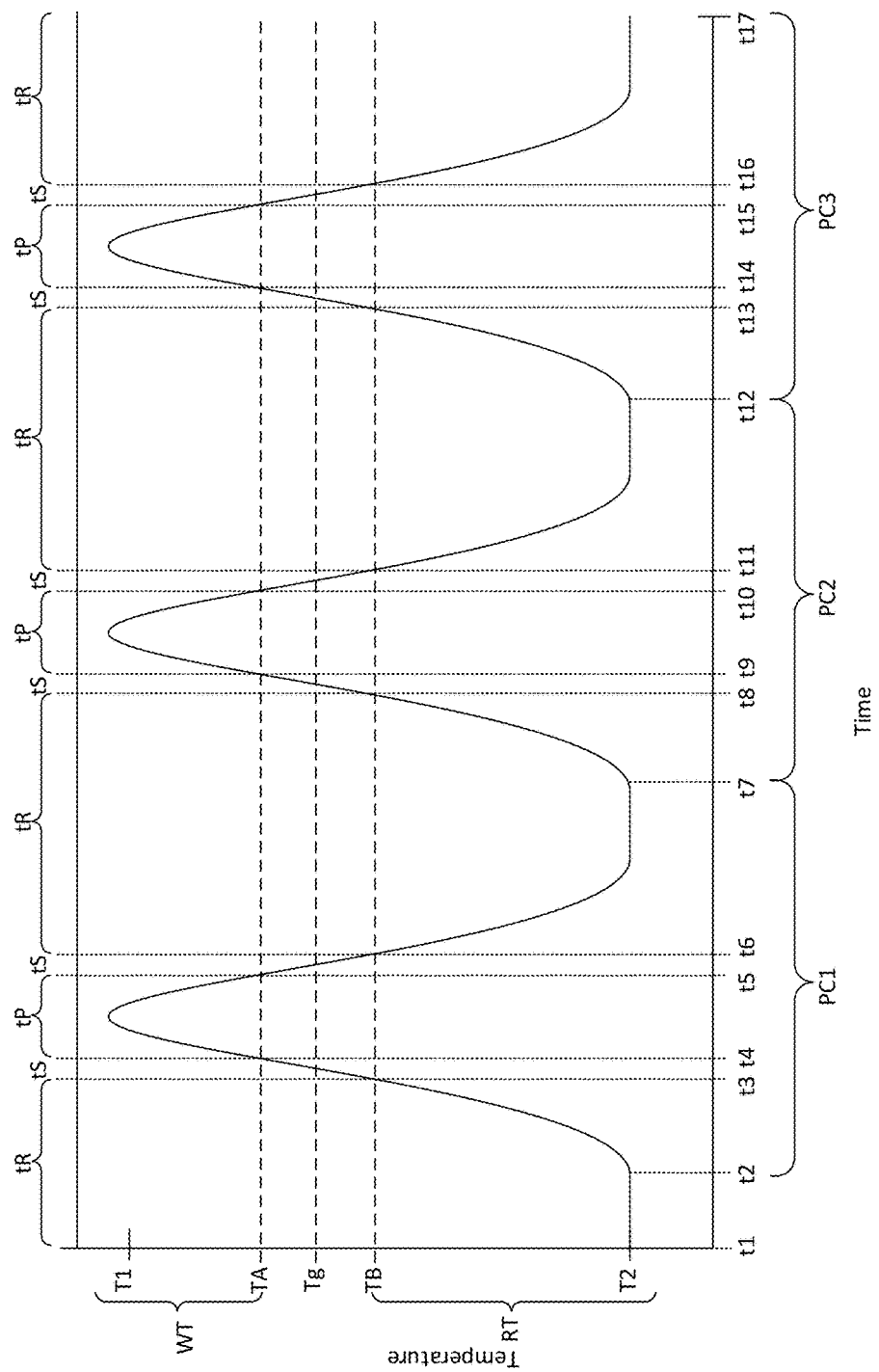
FIG. 14 shows a graph of temperature versus time.

With reference to FIG. 14, temperature profile 300 for electret 8 in memory cell 2 is shown as a graph of temperature versus time. Here, three programming cycles for storing a bit and state of polarization in polarizable member 7 are shown: first programming cycle PC1, second programming cycle PC2, and third programming cycle PC3. At time t1 proceeds first programming cycle PC1, polarizable member 7 is at second temperature T2. From time t2 to time t3, electret 8 is heated from second temperature T2 to intermediate temperature TB (that is less than Tg). From time t3 to time t4, electret 8 is heated from intermediate temperature TB (that is less than Tg) to intermediate temperature TA, during which time electret 8 passes through Tg, and the period is referred to as switching time tS. From time t4 to time t5, electret 8 is heated from intermediate temperature TA to first temperature T1 and from first temperature T1 to intermediate temperature TA during programming time tP to program polarizable member 7 in a state of polarization (the polarized state or the non-polarized state), depending on a presence and magnitude of an electric field across polarizable member 7 produced by the first voltage at the thermal electrode 4 and second voltage at program electrode 6. Thereafter during switching time tS from time t5 to time t6, polarizable member 7 is cooled from intermediate temperature TA to intermediate temperature TB below Tg. From time t6 to time t7, electret 8 is cooled from intermediate temperature TB to second temperature T2. From time t7 to time t8, electret 8 is heated from second temperature T2 to intermediate temperature TB. The period from time T6 to time T8 is retention time tR during which memory cell 2 maintains the state of polarization of the bit programmed into electret 8 during programming time tP (from time t4 to time t5 above Tg). Accordingly, the temperature range from intermediate temperature TA to first temperature T1 is referred to as write temperature WT because electret 8 is subjected to programming. Further, the temperature range from intermediate temperature TB to second temperature T2 is referred to as retention temperature RT because electret 8 retains the state a polarization program into electret 8 during write temperature WT. Second programming cycle PC2 occurs from time t7 to time t12. Additionally, third programming cycle PC3 occurs from time t12 to time t17.

Figure 15:
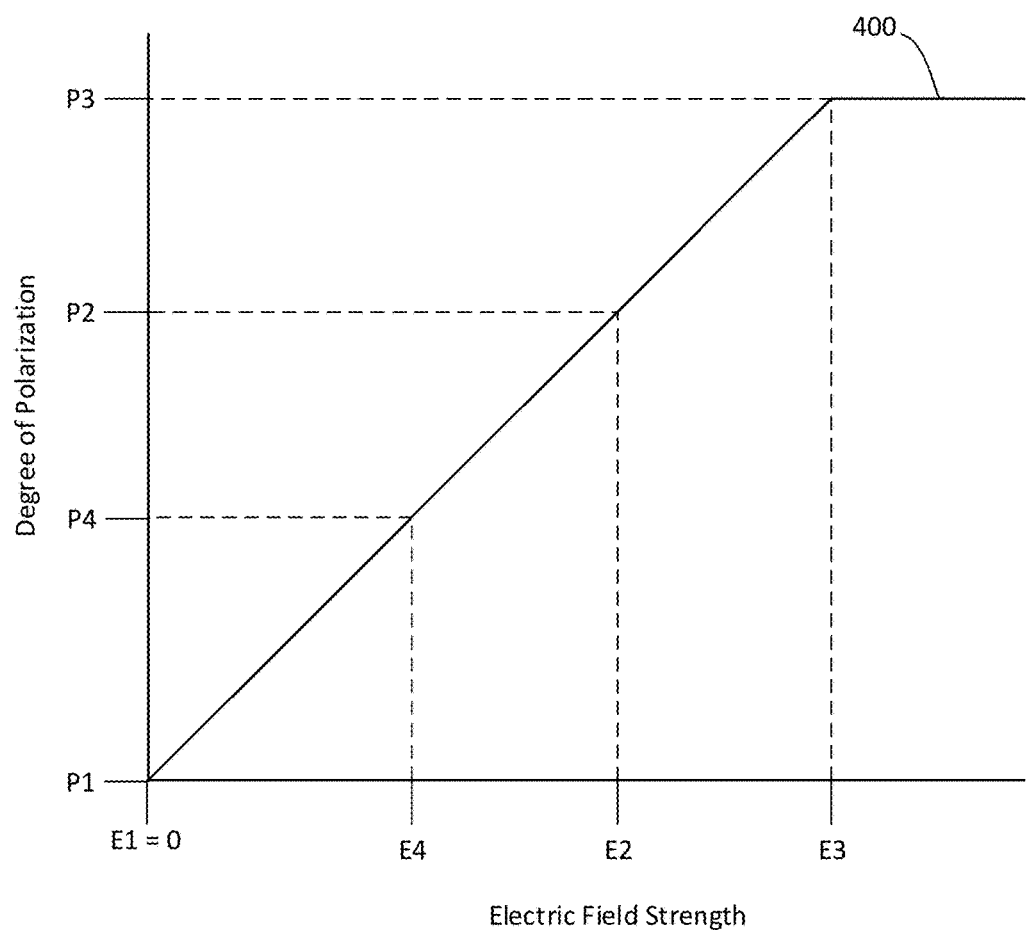
FIG. 15 shows a graph of degree of polarization versus electric field strength.
Figure 19:
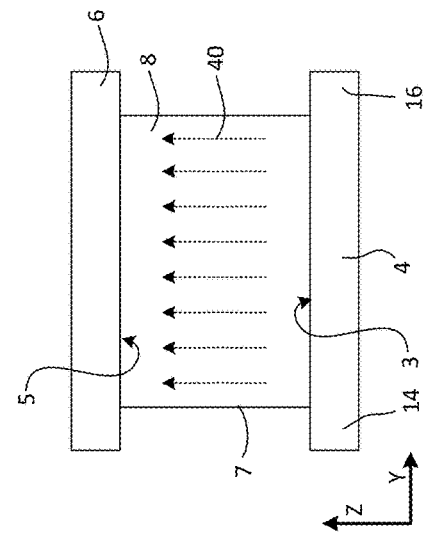
FIG. 19 shows a memory cell including a polarizable member in a polarized state.

With reference to FIG. 15, polarization curve 400 of electret 8 in polarizable member 7 of memory cell 2 is shown as a graph of degree of polarization versus electric field strength. Here, degree of polarization increases as electric field strength increases. Degree of polarization (P1, P2, P3, P4) and electric field strength (E1, E2, E3, E4) corresponds to the data in FIG. 13. It will be appreciated that, at first electric field strength E1 (having a magnitude of zero), first degree of polarization P1 is zero such that the plurality of electric dipole moments in electret 8 are isotropically distributed, and electret 8 is in the non-polarized state with the zero bit. It further will be appreciated that at electric field strength greater than zero, the degree of polarization of electret 8 increases with increasing field strength such that P4<P2<P3, respectively for E4<E2<E3. Here, for an electrical field strength greater than third electrical field strength E3, the degree of polarization does not change because third degree of polarization P3 is a maximum value due to the permanent electric dipole moments in electret 8 polarizable member 7 are oriented in a same direction and perpendicular to second surface five of program electrode 6 of memory cell 2 as shown in FIG. 19.

Figure 16:
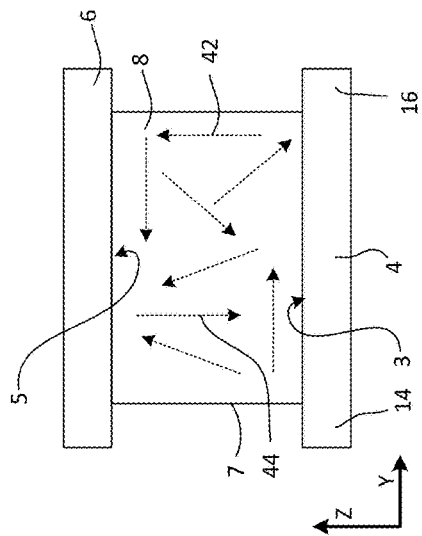
FIG. 16 shows a memory cell including a polarizable member in a non-polarized state.
Figure 17:
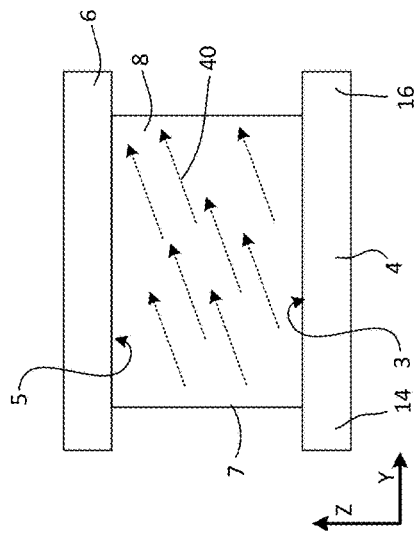
FIG. 17 shows a memory cell including a polarizable member in a polarized state.
Figure 18:
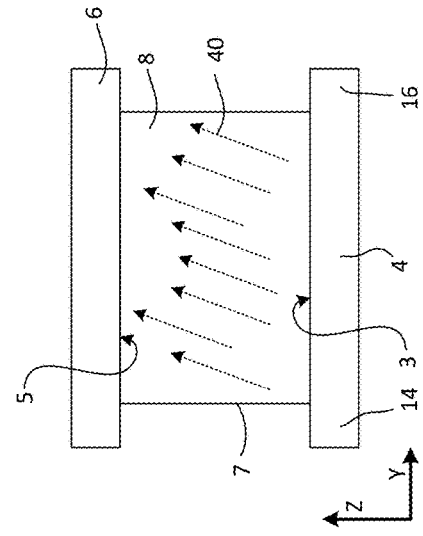
FIG. 18 shows a memory cell including a polarizable member in a polarized state.

With reference to FIG. 16, for first degree of polarization P1, a distribution of orientations for permanent electric dipole moments in electret 8 is isotropic with respect to second surface 5 of program electrode 6 such that polarizable member 7 is in first non-polarized state S1. With reference to FIG. 17, for fourth degree of polarization P4, the distribution of orientations for permanent electric dipole moments in electret 8 is anisotropic with respect to second surface 5 of program electrode 6 such that polarizable member 7 is in fourth polarized state S4. With reference to FIG. 18, for second degree of polarization P2, the distribution of orientations for permanent electric dipole moments in electret 8 is anisotropic with respect to second surface 5 of program electrode 6 such that polarizable member 7 is in second polarized state S2. With reference to FIG. 19, for third degree of polarization P3, a distribution of orientations for permanent electric dipole moments in electret 8 is anisotropic with respect to second surface 5 of program electrode 6 such that polarizable member 7 is in third polarized state S4. It will be appreciated that the degree of polarization P3>P2>P4>P1=0.

Figure 20:
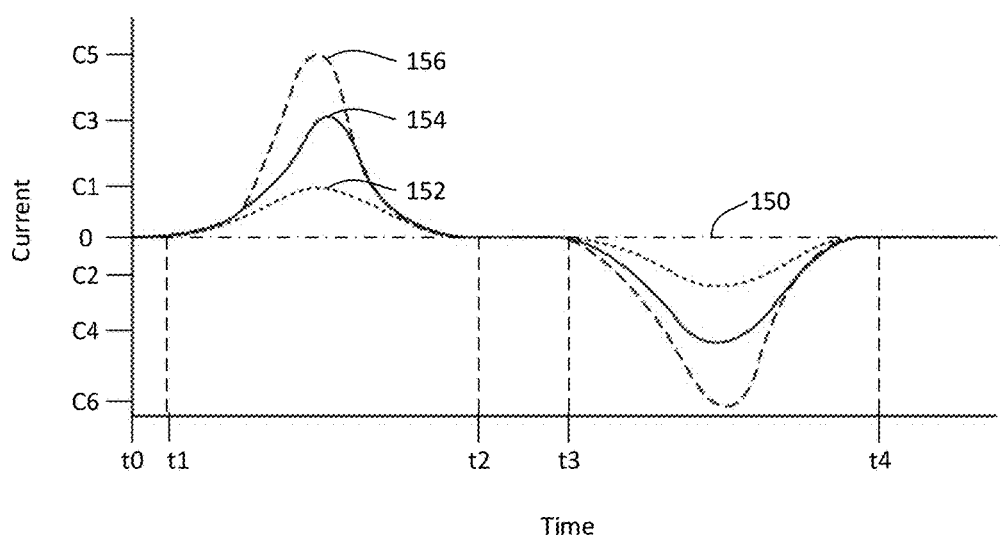
FIG. 20 shows a graph of current versus time.

In an embodiment, with reference to FIG. 4, switch 46 is connected across polarizable member 7 to detect the value of the bit, degree of polarization, or state of polarization of memory cell 2. Here, depending on the degree of polarization of electret 8 in polarizable member 7, a magnitude of current from actuation of switch 46 across polarization member 7 detected by amplifier 52 provides the value of the bit stored in polarizable member 7 or the state of polarization of polarizable member 7 for memory cell 2. With reference to FIG. 20, a graph of current versus time shows data for curve 150 for first non-polarized state S1, curve 152 for fourth polarized state S4, curve 154 four second polarized state S2, and curve 156 for third polarized state S3 of electret 8 corresponding to data shown in FIG. 13. At time t0, switch 46 is open such that current does not flow from first surface 3 to second service 5 of polarizable member 7. At time t1, switch 46 is closed such that current can flow from first surface 3 to second surface 5 (in the case of curves 152, 154, 156). Between time t2 and time t3, switch 46 is opened, and current can be detected from time t3 to time t4 in response to a voltage difference (between first surface 3 and second surface 5 of polarizable member 7) being re-established for polarized states S2, S3, and S4 but not for first non-polarized state S1.

The memory cell described rely on localized heating to enable the high-speed polarization of the cell electrically so that in the absence of this local heating the resulting polarization, or memory state, is locked in for a very long time even in the presence of a depolarization field. Such a non-volatile memory has an intrinsic advantage of immunity to program disturb and read disturb, two common modes of memory lost. The electret material of choice is according to the desired operation temperature range. When glassy polar polymer is the electret material, the polymer's glass transition temperature (Tg) is generally >100 C above the maximum operation temperature of the memory. For high-speed programming, the local heating generally need to heat the electret material to 50 to 150 C above Tg. So the heat pulse needs to locally raise the temperature by 200 C or more. At the high temperature end, the programming time can be as short as a few picoseconds. Within such general boundary, the memory is capable of operating at temperature ranging from liquid helium temperature of −269 C all the way to over 300 C, as long as the proper electret material is used. In the case of glassy polar polymer, the desirable property can be custom synthesized and the possibility is almost limitless. The memory cell can be large or small. There is no upper size limit. The low end of the size limit can be down to 3 nm as long as the polar polymer have very high dipole density and the programming time is very short. At cell size down to 3 nm, the polymer layer thickness is desirable to be less than 3 nm. Polymer film thickness down to 1 nm is possible. This scaling potential is extremely important. As long as the electret material is encapsulated, repeated heating to well above Tg will not degrade the material so the endurance is very high. For high-speed programming and erase, the endurance is expected to be $>10^{16}$ cycles. The nature of the memory allows it to be stacked to achieve 3-D integration and even higher density.

According to an embodiment, polarization member 7 is the ultra thin film. A thickness of the ultra thin film can be, e.g., less than 500 nm, specifically less than 200 nm, more specifically less than 100 nm, further specifically less than 20 nm, and more further specifically from 1 nm to 15 nm.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A memory cell comprising:
   a polarizable member comprising an electret to store a plurality of bits;
   a thermal electrode to heat the polarizable member; and
   a program electrode opposing the thermal electrode to program the polarizable member in a bit comprising a polarized state or a non-polarized state,
   the polarizable member being interposed between the thermal electrode and the program electrode.

2. The memory cell of claim 1, further comprising an encapsulation member to encapsulate the polarizable member,
   wherein the electret is disposed in the encapsulation member.

3. The memory cell of claim 2, wherein the encapsulation member comprises an oxide, a nitride, a silicide, or a combination comprising at least one of the foregoing encapsulants.

4. The memory cell of claim 1, further comprising a switch in electrical communication with the polarizable member and comprising:
   a first switch terminal in electrical communication with the thermal electrode; and
   a second switch terminal in electrical communication with the program electrode,
   wherein the switch is configured:
      to electrically connect, in response to the switch being closed, the thermal electrode to the program electrode to depolarize a surface of the electret; and
      to electrically disconnect, in response to the switch being open, the thermal electrode from the program electrode such that the surface of the electret is configured to be polarized.

5. The memory cell of claim 1, wherein the electret comprises a glassy polymer that comprises a net electric dipole moment that is not zero.

6. The memory cell of claim 5, wherein the glassy polymer comprises a glass transition temperature (Tg) that is greater than an operation temperature of the of the memory cell.

7. The memory cell of claim 6, wherein the glassy polymer further comprises a polar organic polymer.

8. The memory cell of claim 7, wherein the polar organic polymer comprises a polyimide, polysulfone, polyether, polyacetal, polyacetaldehyde, polyacrylamide, poly(acrylic acid), polyacrylonitrile, polyamide, polyamide imide, polyaniline, polybenzimidazole, polybenzobisoxazole, polybenzobisthiazole, polybutylene terephthalate, polycarbonate, 1,4-polychloroprene, polychlorotrifluoroethylene, poly(diethylsiloxane), poly(dimethylsiloxane), poly(diphenylsiloxane), polyester, polyether ketone, polyether etherketone, polyethersulfone, poly(ethylene imine), poly(ethylene oxide), poly(ethyleneterephthalate), poly(hexamethylene adipamide), poly(hexamethylene sebacamide), polyhydroxybutyrate, polyisocyanate, polyisocyanide, 1,4-polyisoprene, polylactam, polylactone, poly(methacrylic acid), poly(methyl acrylate), poly(methyl methacrylate), poly(4-methyl pentene), poly(methyl styrene), poly(methylene oxide), poly(methyl phenyl siloxane), poly(phenylene terephthalamide), polynitrile, poly(methyl styrene), poly(3-propionate), polypyrazole, poly(pyromellitimide-1,4-diphenyl ether), polypyrrole, polyquinoxaline, polystyrene, polysulfide, polytetrafluoroethylene, polythienyl vinylene, polythiopene, poly(trimethylene ethylene urethane), polyurea, polyurethane, poly(vinyl acetate), poly(vinyl carbazole), poly(vinyl chloride), poly(vinyl fluoride), poly(vinyl formal), poly(2-vinyl pyridine), poly(n-vinyl pyrrolidone), poly(vinylidene chloride), poly(vinylidene fluoride), poly(p-xylylene), vinyl polymer, polyarylate, polyphenylene sulfide, polyetherimide, polyphenylsulfone, or a combination comprising at least one of the foregoing.

9. The of claim 6, wherein the glassy polymer further comprises an amorphous structure at a temperature less than the glass transition temperature.

10. The memory cell of claim 1, wherein the polarizable member further comprises an ultra thin film.

11. The memory cell of claim 6, wherein the thermal electrode comprises:
a first terminal configured to receive a heating current that comprises a first pulse width and first voltage; and
a second terminal configured to communicate the heating current from the thermal electrode,
wherein the thermal electrode is heated in response to the heating current present in the thermal electrode.

12. The memory cell of claim 11, further comprising a first power source in electrical communication with the first terminal to communicate the heating current to the thermal electrode.

13. The memory cell of claim 11, wherein the polarizable member is heated above the glass transition temperature in a presence of the heating current at the thermal electrode.

14. The memory cell of claim 11, wherein the program electrode is configured to receive a program voltage that comprises:
a second pulse width; and
a second voltage.

15. The memory cell of claim 14, further comprising a second power source in electrical communication with the program electrode to provide the program voltage to the program electrode.

16. The memory cell of claim 14, wherein the polarizable member is configured:
to receive the first voltage at the thermal electrode and the second voltage at the program electrode;
to be programmed in the polarized state in response to receipt of the first voltage and the second voltage above the glass transition temperature, wherein the first voltage is different than the second voltage;
to be programmed in the non-polarized state in response to receipt of the first voltage and the second voltage above the glass transition temperature, wherein the first voltage is the same as the second voltage; and
to maintain the bit below the glass transition temperature.

17. The memory cell of claim 16, wherein the bit comprises a magnitude, based on a degree of polarization of the electret with respect to a direction perpendicular to a surface of the program electrode that is in contact with the polarizable member.

18. The memory cell of claim 1, wherein the polarizable member is in the polarized state.

19. The memory cell of claim 1, wherein the polarized state comprises a degree of polarization of the electret with respect to a direction perpendicular to a surface of the program electrode that is in contact with the polarizable member.

20. The memory cell of claim 1, wherein the polarizable member is in the non-polarized state.

21. The memory cell of claim 1, wherein a programming time of the polarizable member is less than 1 ns.

22. A random access memory comprising:
a plurality of addressable memory cells, the memory cell comprising:
a thermal electrode;
a program electrode opposing the thermal electrode;
a polarizable member interposed between the thermal electrode and the program electrode, the polarizable member comprising an electret to store a plurality of bits.

23. The random access memory of claim 22, wherein the plurality of addressable memory cells comprises:
a first memory cell; and
a second memory cell proximate to the first memory cell.

24. The random access memory of claim 22, wherein the first memory is laterally disposed to the second memory cell.

25. The random access memory of claim 22, wherein the plurality of addressable memory cells further comprises a third memory cell that is stackedly disposed to the first memory cell.

26. The random access memory of claim 22, wherein the first memory is stackedly disposed to the second memory cell.

27. The random access memory of claim 22, wherein the random access memory is a non-volatile memory.

* * * * *